(12) United States Patent
Yoon et al.

(10) Patent No.: US 11,488,542 B2
(45) Date of Patent: Nov. 1, 2022

(54) ORGANIC LIGHT EMITTING DISPLAY DEVICE

(71) Applicant: Samsung Display Co., Ltd., Yongin-si (KR)

(72) Inventors: Changnoh Yoon, Seoul (KR); Jin-Wook Yang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 47 days.

(21) Appl. No.: 17/099,690

(22) Filed: Nov. 16, 2020

(65) Prior Publication Data

US 2021/0074225 A1 Mar. 11, 2021

Related U.S. Application Data

(62) Division of application No. 16/168,542, filed on Oct. 23, 2018, now Pat. No. 10,867,560.

(30) Foreign Application Priority Data

Nov. 28, 2017 (KR) .......................... 10-2017-0160992

(51) Int. Cl.
*G09G 3/3291* (2016.01)
*G09G 3/3233* (2016.01)
*H01L 27/32* (2006.01)

(52) U.S. Cl.
CPC .......... *G09G 3/3291* (2013.01); *G09G 3/3233* (2013.01); *H01L 27/3216* (2013.01); *H01L 27/3218* (2013.01); *H01L 27/3276* (2013.01); *G09G 2300/043* (2013.01); *G09G 2300/0426* (2013.01); *G09G 2300/0452* (2013.01); *G09G 2310/08* (2013.01)

(58) Field of Classification Search
CPC ......... G09G 2310/0297; G09G 3/3225; G09G 3/3648
See application file for complete search history.

(56) References Cited

U.S. PATENT DOCUMENTS 4,724,433 A * 2/1988 Inoue ................... G09G 3/3688
345/87
10,679,551 B2 6/2020 Yang et al.
(Continued)

FOREIGN PATENT DOCUMENTS

CN 104112422 A 10/2014
CN 109389941 A 2/2019
(Continued)

*Primary Examiner* — Yuzhen Shen
(74) *Attorney, Agent, or Firm* — Lewis Roca Rothgerber Christie LLP

(57) ABSTRACT

An organic light emitting display device includes: a display panel including a plurality of pixel rows each including first pixel groups alternating with second pixel groups; a gate driver configured to provide a first group gate signal to the first pixel groups, and to provide a second group gate signal to the second pixel groups; a data driver configured to output data voltages to a plurality of output line groups; and a connection controller configured to connect the output line groups to a first data line group in response to a first connection control signal, and to connect the output line groups to a second data line group in response to a second connection control signal.

7 Claims, 13 Drawing Sheets

(56) References Cited

U.S. PATENT DOCUMENTS

| | | | |
|---|---|---|---|
| 2006/0081850 A1* | 4/2006 | Lee | G02F 1/136286 257/72 |
| 2007/0103415 A1 | 5/2007 | Ichiyama | |
| 2012/0001896 A1* | 1/2012 | Han | G09G 3/3233 345/76 |
| 2014/0084805 A1 | 3/2014 | Kim et al. | |
| 2014/0313180 A1 | 10/2014 | Woo | |
| 2016/0125798 A1 | 5/2016 | Park et al. | |
| 2016/0240146 A1 | 8/2016 | Lee et al. | |
| 2017/0287396 A1 | 10/2017 | Akimoto | |
| 2018/0247587 A1 | 8/2018 | Kimura | |

FOREIGN PATENT DOCUMENTS

| | | |
|---|---|---|
| KR | 10-2016-0071422 A | 6/2016 |
| KR | 10-2017-0031323 A | 3/2017 |

* cited by examiner

ORGANIC LIGHT EMITTING DISPLAY DEVICE

CROSS-REFERENCE TO RELATED APPLICATIONS

This application is a divisional of U.S. patent application Ser. No. 16/168,542, filed Oct. 23, 2018, which claims priority to and the benefit of Korean Patent Application No. 10-2017-0160992, filed Nov. 28, 2017, the entire content of both of which is incorporated herein by reference.

BACKGROUND

1. Field

Aspects of example embodiments of the present invention relate to display devices.

2. Description of the Related Art

An organic light emitting display device may display an image using an organic light emitting diode (OLED). In the OLED, holes provided from an anode and electrons provided from a cathode are combined in a light emitting layer between the anode and the cathode to emit light. To reduce the variation between pixels, the organic light emitting display device may include a pixel structure where a threshold voltage compensation operation for a driving transistor is performed inside the pixel.

As a resolution of the organic light emitting display device increases, a complexity of a driver (e.g., the number of output channels of a data driver) may increase. To address this problem, outputs of the data driver may be controlled using a demultiplexer (or a selector), and a plurality of data lines may share one channel. For example, to reduce the number of the output channels of the data driver, the demultiplexer may divide a data writing period into N portions such that data signals from one output channel are provided to N data lines in a time divisional manner. However, in a high resolution display device, a threshold voltage compensation time for a driving transistor may be reduced by rapid switching of the data signals by the demultiplexer, and the threshold voltage of the driving transistor may not be sufficiently compensated. Accordingly, a display defect, such as a mura in a displayed image, may occur.

The above information disclosed in this Background section is only for enhancement of understanding of the background and therefore it may contain information that does not constitute prior art.

SUMMARY

Some example embodiments provide an organic light emitting display device capable of having a sufficient threshold voltage compensation time and compensating for a pixel variation.

According to some example embodiments, an organic light emitting display device includes: a display panel including a plurality of pixel rows each including first pixel groups alternating with second pixel groups, a gate driver configured to provide a first group gate signal to the first pixel groups, and to provide a second group gate signal to the second pixel groups, a data driver configured to output data voltages to a plurality of output line groups, and a connection controller configured to connect the output line groups to a first data line group in response to a first connection control signal, and to connect the output line groups to a second data line group in response to a second connection control signal. An on-period of the second group gate signal partially overlaps an on-period of the first group gate signal, the first data line group is connected to the first pixel groups included in the pixel rows, the second data line group is connected to the second pixel groups included in the pixel rows, and an on-period of the first connection control signal partially overlaps an on-period of the second connection control signal.

In example embodiments, the first pixel groups included in each pixel row may receive the first group gate signal through a first group gate line, and the second pixel groups included in each pixel row may receive the second group gate signal through a second group gate line.

In example embodiments, odd-numbered pixel groups included in each pixel row may correspond to the first pixel groups, and even-numbered pixel groups included in each pixel row may correspond to the second pixel group.

In example embodiments, each of the first pixel groups may include a first pixel and a second pixel adjacent to the first pixel, the first pixel may include a first sub-pixel emitting a first color light, and a second sub-pixel emitting a second color light, and the second pixel may include a third sub-pixel emitting a third color light, and a fourth sub-pixel emitting the second color light.

In example embodiments, a first data line connected to the first sub-pixel and a second data line connected to the second sub-pixel may be between the first sub-pixel and the second sub-pixel, and extend in a pixel column direction, and a third data line connected to the third sub-pixel and a fourth data line connected to the fourth sub-pixel may be between the third sub-pixel and the fourth sub-pixel, and extend in the pixel column direction.

In example embodiments, no data line for providing the data voltages may be between the first pixel and the second pixel.

In example embodiments, a layout of the first sub-pixel and a layout of the second sub-pixel may be symmetric with respect to the pixel column direction.

In example embodiments, the first sub-pixel nay includes a driving transistor including a first terminal connected to a first node, a second terminal connected to a second node, and a gate terminal connected to a third node, a first transistor including a first terminal receiving the data voltage, a second terminal connected to the first node, and a gate terminal receiving the first group gate signal, a second transistor including a first terminal connected to the second node, a second terminal connected to the third node, and a gate terminal receiving the first group gate signal, a third transistor including a first terminal connected to an initialization voltage, a second terminal connected to the third node, and a gate terminal receiving an initialization control signal, a fourth transistor including a first terminal connected to a first power supply voltage, a second terminal connected to the first node, and a gate terminal receiving an emission control signal, a fifth transistor including a first terminal connected to the second node, a second terminal connected to a fourth node, and a gate terminal receiving the emission control signal, a sixth transistor including a first terminal connected to the initialization voltage, a second node connected to the fourth node, and a gate terminal receiving the initialization control signal, a storage capacitor connected between the first power supply voltage and the third node, and an organic light emitting diode including a first electrode connected to the fourth node, and a second electrode connected to a second power supply voltage lower than the first power supply voltage.

In example embodiments, one frame period may include an initialization period, a compensation period and an emission period in sequence. During the initialization period, voltages of the third node and the fourth node may be initialized by the initialization voltage. During the compensation period, the data voltage may be transferred to the driving transistor, and a threshold voltage of the driving transistor is compensated. During the emission period, the organic light emitting diode may emit light.

In example embodiments, during the initialization period, the first transistor and the second transistor may be turned on. The compensation period may include a first compensation period, a second compensation period and a third compensation period in sequence. In the first compensation period, one of the first and second connection control signals may have an on-level, and another one of the first and second connection control signals may have an off-level. In the second compensation period, both of the first and second connection control signals may have the on-level. In the third compensation period, the one of the first and second connection control signals may have the off-level, and the another one of the first and second connection control signals may have the on-level.

In example embodiments, in the first and second compensation periods, the first node may be electrically connected to an output amplifier of the data driver.

In example embodiments, in the third compensation period, the first terminal of the first transistor may be in a floating state.

According to example embodiments, there is provided an organic light emitting display device including a display panel including a first pixel row and a second pixel row adjacent to the first pixel row, the first pixel row including first pixel groups alternating with second pixel groups, and the second pixel row including third pixel groups alternating with fourth pixel groups, a gate driver configured to provide a first group gate signal to the first pixel groups, to provide a second group gate signal to the second pixel groups, to provide a third group gate signal to the third pixel groups, and to provide a fourth group gate signal to the fourth pixel groups, a data driver configured to output data voltages to a plurality of output line groups, and a connection controller configured to connect the output line groups to a first data line group in response to a first connection control signal, to connect the output line groups to a second data line group in response to a second connection control signal, to connect the output line groups to a third data line group in response to a third connection control signal, and to connect the output line groups to a fourth data line group in response to a fourth connection control signal. An on-period of the second group gate signal partially overlaps an on-period of the first group gate signal. The first data line group is connected to the first pixel groups included in the first pixel row, the second data line group is connected to the second pixel groups included in the first pixel row, the third data line group is connected to the third pixel groups included in the second pixel row, and the fourth data line group is connected to the fourth pixel groups included in the second pixel row. An on-period of the first connection control signal partially overlaps an on-period of the second connection control signal.

In example embodiments, one frame period may include an initialization period, a compensation period and an emission period in sequence. During the initialization period, a gate terminal of a driving transistor of a sub-pixel included in each of the first pixel groups may be initialized by an initialization voltage. During the compensation period, the data voltage may be transferred to the driving transistor, and a threshold voltage of the driving transistor may be compensated. During the emission period, an organic light emitting diode of the sub-pixel may emit light.

In example embodiments, the compensation period may include a first compensation period, a second compensation period and a third compensation period in sequence. In the first compensation period, the first connection control signal may have an on-level, and the second connection control signal may have an off-level. In the second compensation period, both of the first and second connection control signals may have the on-level. In the third compensation period, the first connection control signal has the off-level, and the second connection control signal may have the on-level.

In example embodiments, in the first and second compensation periods, a data line for providing the data voltage to the sub-pixel may be electrically connected to an output amplifier of the data driver.

In example embodiments, in the third compensation period, the data line for providing the data voltage to the sub-pixel may have in a floating state.

In example embodiments, each of the first pixel groups may includes a first pixel and a second pixel adjacent to the first pixel, the first pixel may include a first sub-pixel emitting a second color light, and a second sub-pixel emitting a third color light, and the second pixel may include a third sub-pixel emitting the second color light, and a fourth sub-pixel emitting a first color light.

In example embodiments, a first data line connected to the first sub-pixel and a second data line connected to the second sub-pixel may be between the first sub-pixel and the second sub-pixel, and extend in a pixel column direction, and a third data line connected to the third sub-pixel and a fourth data line connected to the fourth sub-pixel may be between the third sub-pixel and the fourth sub-pixel, and extend in the pixel column direction.

In example embodiments, each of the third pixel groups may include a third pixel and a fourth pixel adjacent to the third pixel, the third pixel may include a fifth sub-pixel emitting the third color light, and a sixth sub-pixel emitting the second color light, the fourth pixel may include a seventh sub-pixel emitting the first color light, and a eighth sub-pixel emitting the second color light, and a fifth data line connected to the seventh sub-pixel and a sixth data line connected to the eighth sub-pixel may be between the second sub-pixel and the third sub-pixel, and extend in the pixel column direction.

As described above, the organic light emitting display device according to example embodiments may include the connection controller that controls connections between output channel groups (or output line groups) of the data driver and data line groups, and a display panel that includes a plurality of pixel rows, each receiving first and second group gate signals through two gate lines. In each pixel row, first pixel groups may alternate with second pixel groups, the first group gate signal may be provided to the first pixel groups, and the second group gate signal that partially overlaps the first group gate signal may be provided to the second pixel groups. Thus, because a threshold voltage compensation period of the first pixel groups may partially overlap a threshold voltage compensation period of the second pixel groups, a threshold voltage compensation time for driving transistors may be sufficiently long. Accordingly, even if the organic light emitting display device has a high resolution, and is operated with a high frequency, a pixel variation may be sufficiently compensated, and a display quality may be improved.

Further, the organic light emitting display device according to example embodiments may reduce a coupling effect to a data line by overlapping an on-period of a first connection control signal with an on-period of a second connection control signal for controlling the connection controller, and thus may prevent (or reduce instances of) an image quality degradation occurring in a particular pattern (e.g., a killer pattern).

BRIEF DESCRIPTION OF THE DRAWINGS

Illustrative, non-limiting example embodiments will be more clearly understood from the following detailed description in conjunction with the accompanying drawings.

DETAILED DESCRIPTION

Aspects of example embodiments of the present invention relate to display devices, for example, organic light emitting display devices capable of compensating for pixel characteristic variations.

Hereinafter, aspects of some example embodiments of the present inventive concept will be explained in more detail with reference to the accompanying drawings.

Figure 1:
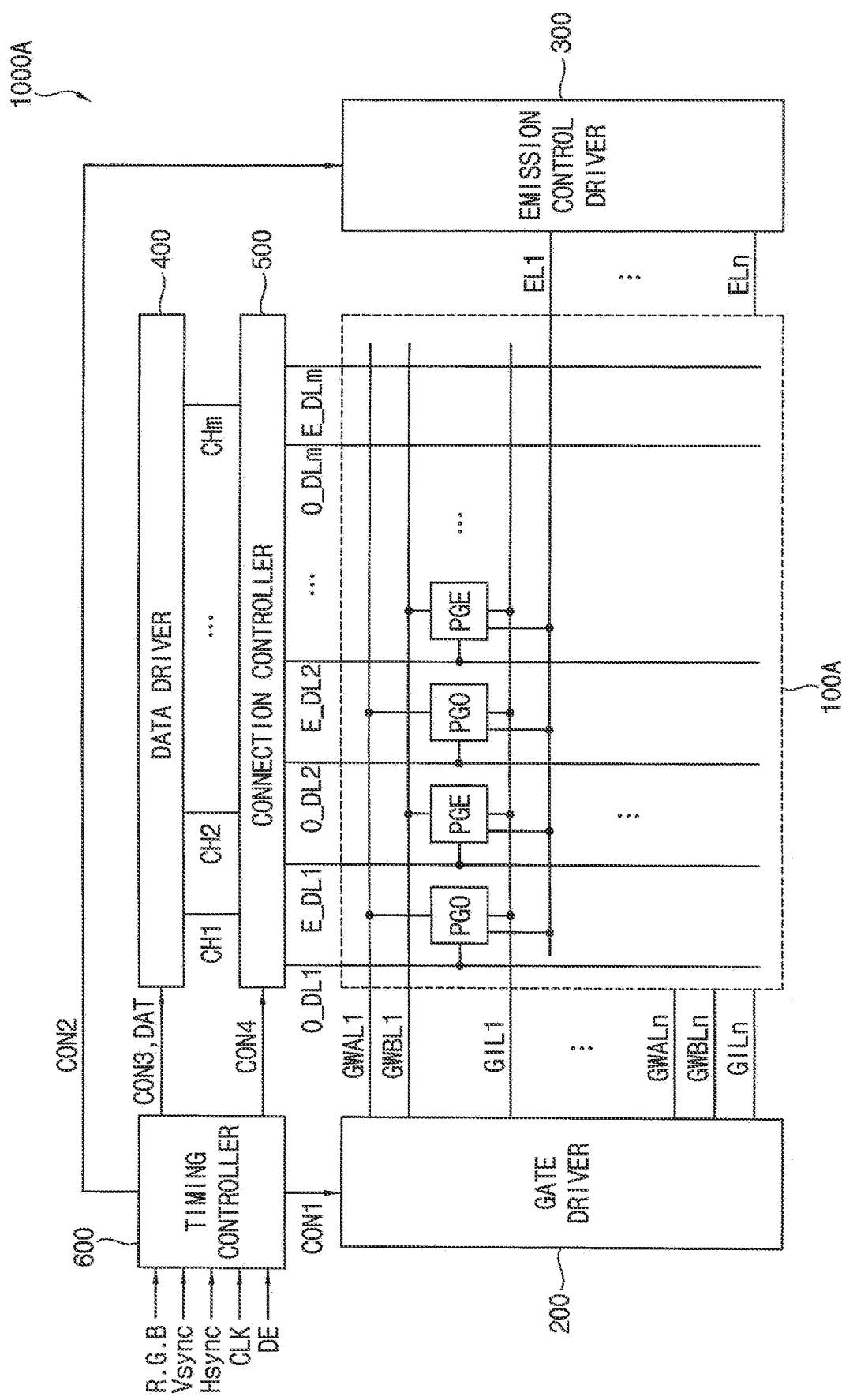
FIG. 1 is a block diagram illustrating an organic light emitting display device according to some example embodiments.

FIG. 1 is a block diagram illustrating an organic light emitting display device according to some example embodiments.

Referring to FIG. 1, an organic light emitting display device 1000A may include a display panel 100A, a gate driver 200, an emission control driver 300, a data driver 400, a connection controller 500 and a timing controller 600.

The display panel 100A may include a plurality of pixel rows. Each pixel row may include first pixel groups PGO and second pixel groups PGE that are alternately arranged. For example, odd-numbered pixel groups included in each pixel row may correspond to the first pixel groups PGO, and even-numbered pixel groups included in each pixel row correspond to the second pixel group PGE. Each of the pixel groups PGO and PGE may include a plurality of pixels, and each of the pixels may include a plurality of sub-pixels.

The gate driver 200 may provide a first group gate signal to the first pixel groups PGO and a second group gate signal to the second pixel groups PGE based on a first control signal CON1 provided from the timing controller 600. For example, with respect to each pixel row, the gate driver 200 may provide the first group gate signal to the first pixel groups PGO through a first group gate line GWAL1 through GWALn, and may provide the second group gate signal to the second pixel groups PGE through a second group gate line GWBL1 through GWBLn.

An on-period of the second group gate signal provided to one pixel row may partially overlap an on-period of the first group gate signal provided to the pixel row. In some example embodiments, the second group gate signal may be a delayed version of the first group gate signal, and may be delayed by a half of one horizontal period from the first group gate signal. In other example embodiments, the first group gate signal may be a delayed version of the second group gate signal, and may be delayed by a half of one horizontal period from the second group gate signal. Accordingly, because a threshold voltage compensation period for the first pixel groups PGO and a threshold voltage compensation period for the second pixel groups PGE may partially overlap each other, the respective sub-pixels may have a sufficient threshold voltage compensation time, and a pixel variation may be sufficiently compensated.

The gate driver 200 may sequentially output an initialization control signal to initialization control lines GIL1 through GILn based on the first control signal CON1. The initialization control lines GIL1 through GILn may be respectively connected to the pixel rows. For example, a k-th one of first through n-th initialization control lines GIL1 through GILn may be connected to the first and second pixel groups PGO and PGE included in a k-th pixel row, where n is an integer greater than 1, and k is an integer between 1 and n.

The emission control driver 300 may sequentially output an emission control signal through emission control lines EL1 through ELn based on a second control signal CON2. The emission control lines EL1 through ELn may be respectively connected to the pixel rows. For example, a k-th one of first through n-th emission control lines EL1 through ELn may be connected to the first and second pixel groups PGO and PGE included in a k-th pixel row.

The data driver 400 may output data voltages (or analog data signals) to a plurality of output channel groups (or a plurality of output line groups) CH1 through CHm based on a third control signal CON3 provided from the timing controller 600.

The connection controller 500 may control connections between the output line groups CH1 through CHm and data line groups O_DL1 through O_DLm and E_DL1 through E_DLm based on a fourth control signal CON4. In some example embodiments, the connection controller 500 may connect the output line groups CH1 through CHm to a first data line group O_DL1 through O_DLm in response to a first connection control signal having an on-level (or an active level), and may connect the output line groups CH1 through CHm to a second data line group E_DL1 through E_DLm in response to a second connection control signal having the on-level. An on-period of the first connection control signal may partially overlap an on-period of the second connection control signal. Accordingly, when a coupling effect by a voltage line near a data line occurs, the data line is connected to an output channel (or an output amplifier) of the data driver 400, and thus the coupling effect may be reduced.

The timing controller 600 may receive an RGB image signal R.G.B, a vertical synchronization signal Vsync, a horizontal synchronization signal Hsync, a main clock signal CLK and a data enable signal DE from an external graphic controller, and may generate output image data DAT corresponding to the RGB image signal R.G.B and the first through fourth control signals CON1, CON2, CON3 and CON4 based on the signals from the external graphic controller. The timing controller 600 may provide the first control signal CON1 to the gate driver 200, may provide the second control signal CON2 to the emission control driver 300, may provide the output image data DAT and the third control signal CON3 to the data driver 400, and may provide the fourth control signal CON4 to the connection controller 500.

FIGS. 2 through 5 are diagrams illustrating a configuration of a display panel included in an organic light emitting display device of FIG. 1.

Referring to FIGS. 2 through 5, the display panel 100A may receive the data voltages through the connection controller 500. In the display panel 100A, two gate lines are arranged with respect to one pixel row, and one data line is arranged with respect to one sub-pixel column.

Figure 2:
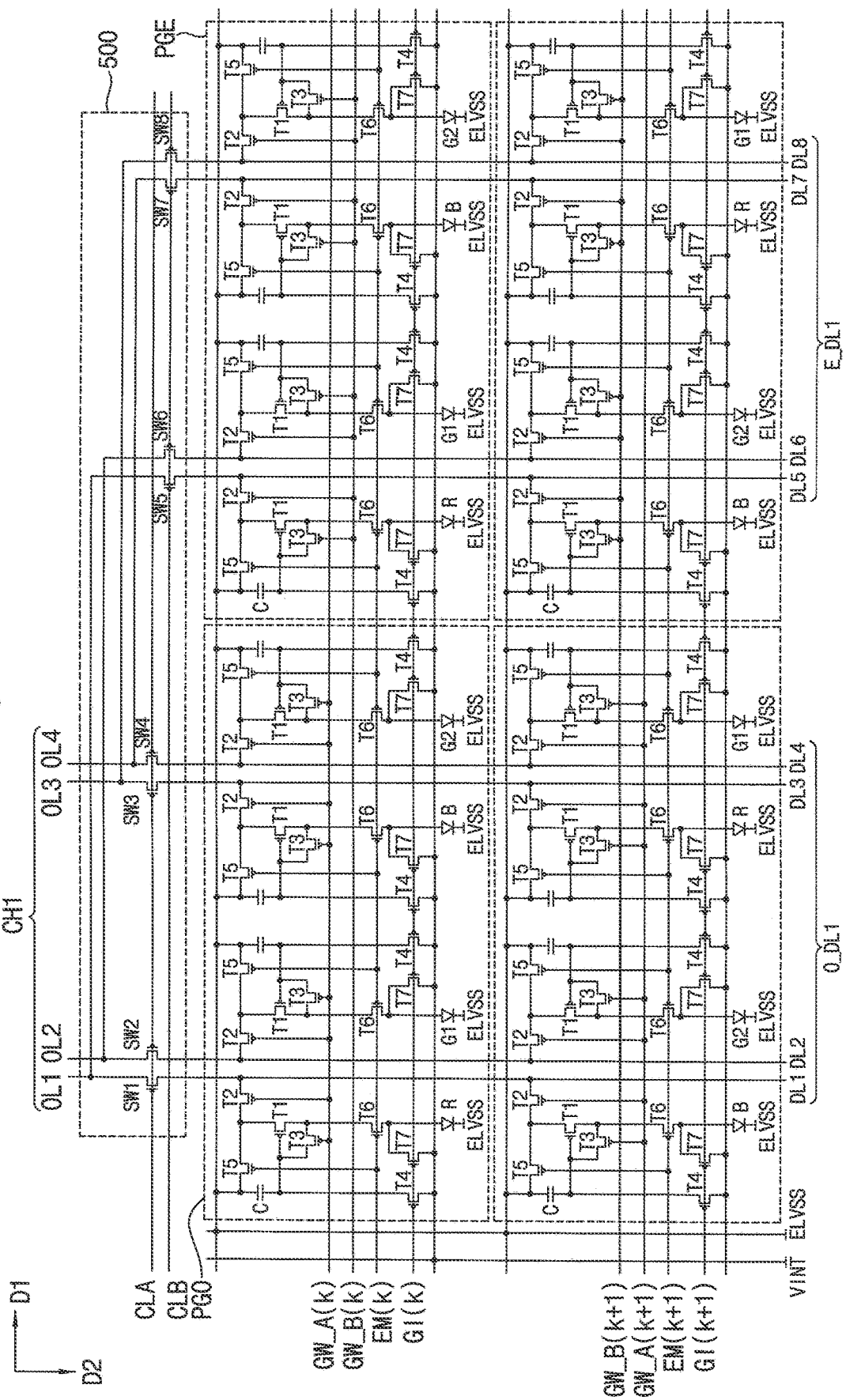
FIGS. 2 through 5 are diagrams illustrating a configuration of a display panel included in an organic light emitting display device of FIG. 1.

As illustrated in FIG. 2, the connection controller 500 may control a connection between a single output line group CH1 and a plurality of data line groups O_DL1 and E_DL1. The connection controller 500 may connect the output line group CH1 to a first data line group O_DL1 in response to a first connection control signal CLA, and may connect the output line group CH1 to a second data line group E_DL1 in response to a second connection control signal CLB. For example, the connection controller 500 may include first through fourth switches SW1, SW2, SW3, and SW4 that connect first through fourth output lines OL1 through OL4 to first through fourth data lines DL1, DL2, DL3, and DL4, respectively. The connection controller 500 may further include fifth through eighth switches SW5, SW6, SW7 and SW8 that connect the first through fourth output lines OL1 through OL4 to fifth through eighth data lines DL5, DL6, DL7, and DL8, respectively.

Figure 3:
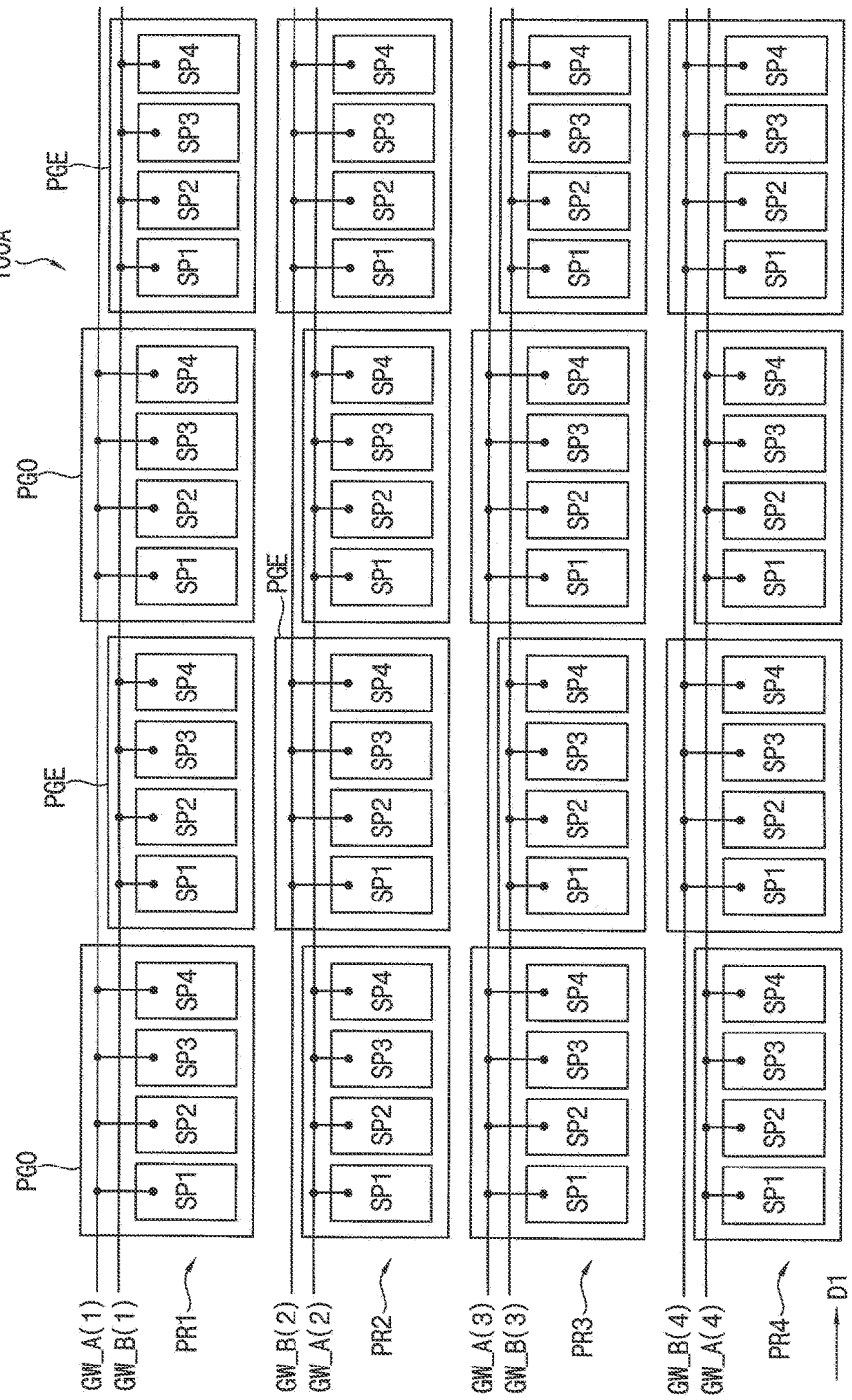

As illustrated in FIGS. 2 and 3, the display panel 100A may include a plurality of pixel rows PR1, PR2, PR3, and PR4. First pixel groups PGO and second pixel groups PGE may be alternately arranged in each pixel row PR1, PR2, PR3, and PR4, and two gate lines are arranged per one pixel row. For example, a first pixel row PR1 may include the first pixel groups PGO as odd-numbered pixel groups and the second pixel groups PGE as even-numbered pixel groups. The first pixel groups PGO included in the first pixel row PR1 may receive a first group gate signal GW_A(1) through a first group gate line GWAL1, and the second pixel groups PGE included in the first pixel row PR1 may receive a second group gate signal GW_B(1) through a second group gate line GWBL1.

Further, each of second through fourth pixel rows PR2, PR3, and PR4 may include the first pixel groups PGO as odd-numbered pixel groups and the second pixel groups PGE as even-numbered pixel groups. The first pixel groups PGO in each of the second through fourth pixel rows PR2, PR3, and PR4 may receive a first group gate signal GW_A(2), GW_A(3), and GW_A(4), and the second pixel groups PGE included in each of the second through fourth pixel rows PR2, PR3, and PR4 may receive a second group gate signal GW_B(2), GW_B(3), and GW_B(4).

Figure 4:
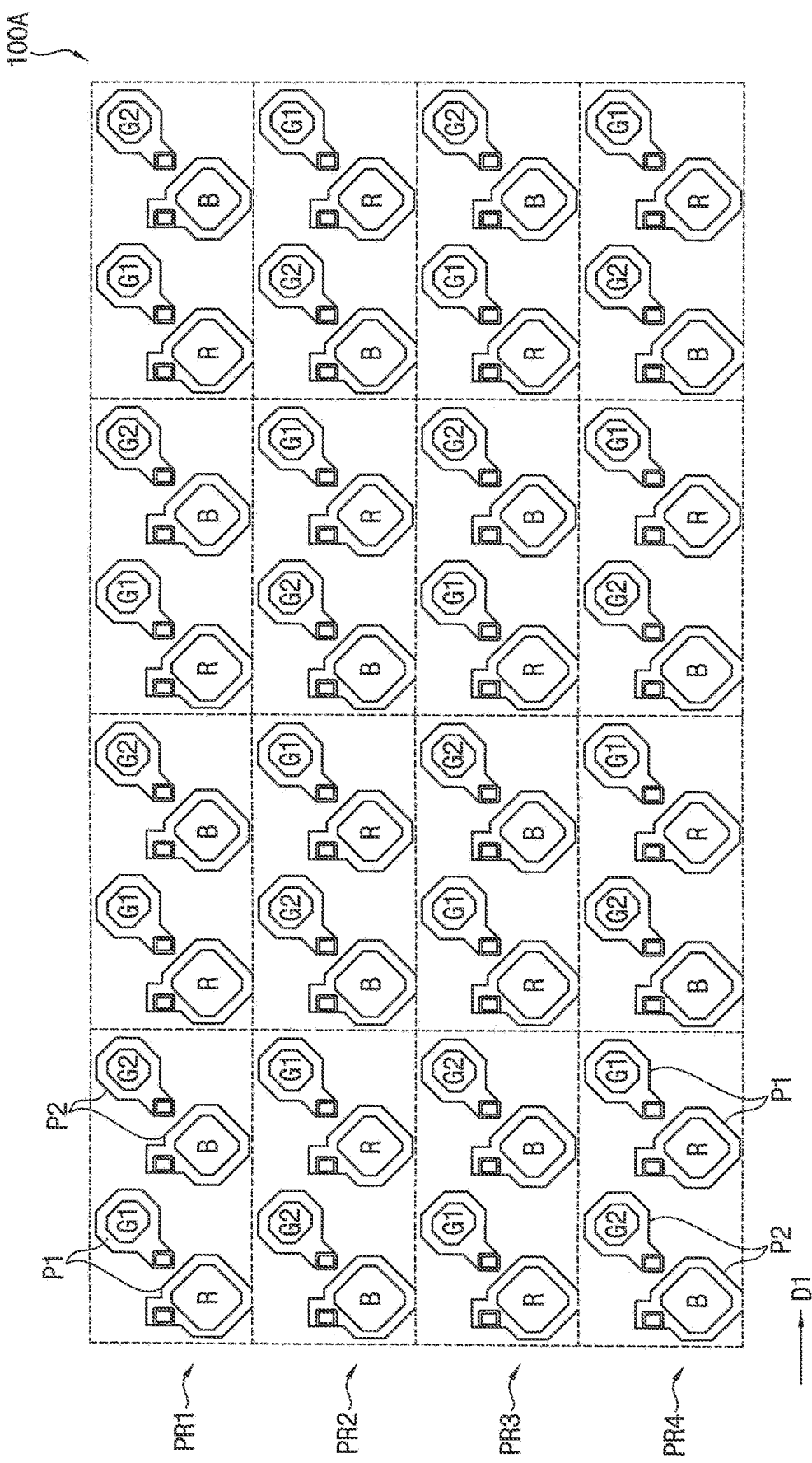

As illustrated in FIG. 4, the display panel 100A may include sub-pixels that are arranged in a pentile pixel arrangement. In some example embodiments, each of the pixel groups PGO and PGE may include a first pixel P1 and a second pixel P2 adjacent to the first pixel P1. The first pixel P1 may include a red sub-pixel emitting a red light and a first green sub-pixel G1 emitting a green light. The second pixel P2 may include a blue sub-pixel B emitting a blue light and a second green sub-pixel G2 emitting the green light.

The pixel groups PGO and PGE in even-numbered pixel rows PR2 and PR4 and the pixel groups PGO and PGE in odd-numbered pixel rows PR1 and PR3 may have different pixel arrangements. For example, in each pixel group PGO and PGE in odd-numbered pixel rows PR1 and PR3, the first pixel P1 may be located at a left portion, and the second pixel P2 may be located at a right portion. In each pixel group PGO and PGE in even-numbered pixel rows PR2 and PR4, the second pixel P2 may be located at a left portion, and the first pixel P1 may be located at a right portion.

Figure 5:
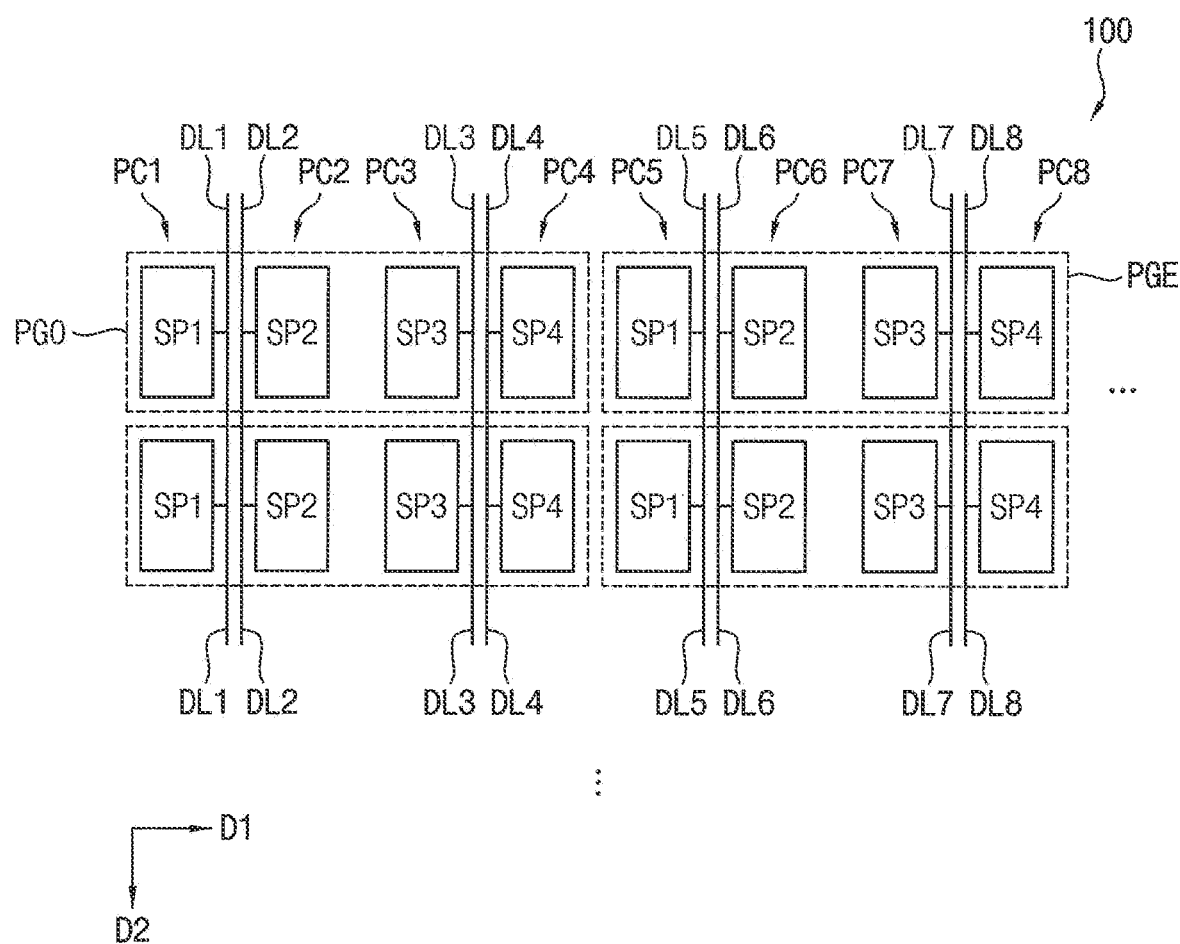

As illustrated in FIGS. 2 and 5, one data line may be arranged per one sub-pixel column. For example, a first data line DL1 connected to a first sub-pixel SP1 and a second data line DL2 connected to a second sub-pixel SP2 may be positioned between the first sub-pixel SP1 and the second sub-pixel SP2 (or between a first sub-pixel column PC1 and a second sub-pixel column PC2), and may extend in a pixel column direction D2. Further, a third data line DL3 connected to a third sub-pixel SP3 and a fourth data line DL4 connected to a fourth sub-pixel SP4 may be positioned between the third sub-pixel SP3 and the fourth sub-pixel SP4 (or between a third sub-pixel column PC3 and a fourth sub-pixel column PC4), and may extend in the pixel column direction D2. A layout of the first sub-pixel SP1 and a layout of the second sub-pixel SP2 may be symmetric with respect to the pixel column direction D2. Accordingly, no data line for providing the data voltages is arranged between the first pixel P1 and the second pixel P2 (or between the second sub-pixel column PC2 and the third sub-pixel column PC3).

Although FIGS. 2 and 5 illustrate an example of an example of an arrangement of sub-pixels SP1, SP2, SP3 and SP4 of each pixel group PGO and PGE, in some example embodiments, each pixel group PGO and PGE may have various sub-pixel arrangements. For example, the pixel group PGO and PGE may include first through fourth sub-pixels emitting different color lights.

Figure 6:
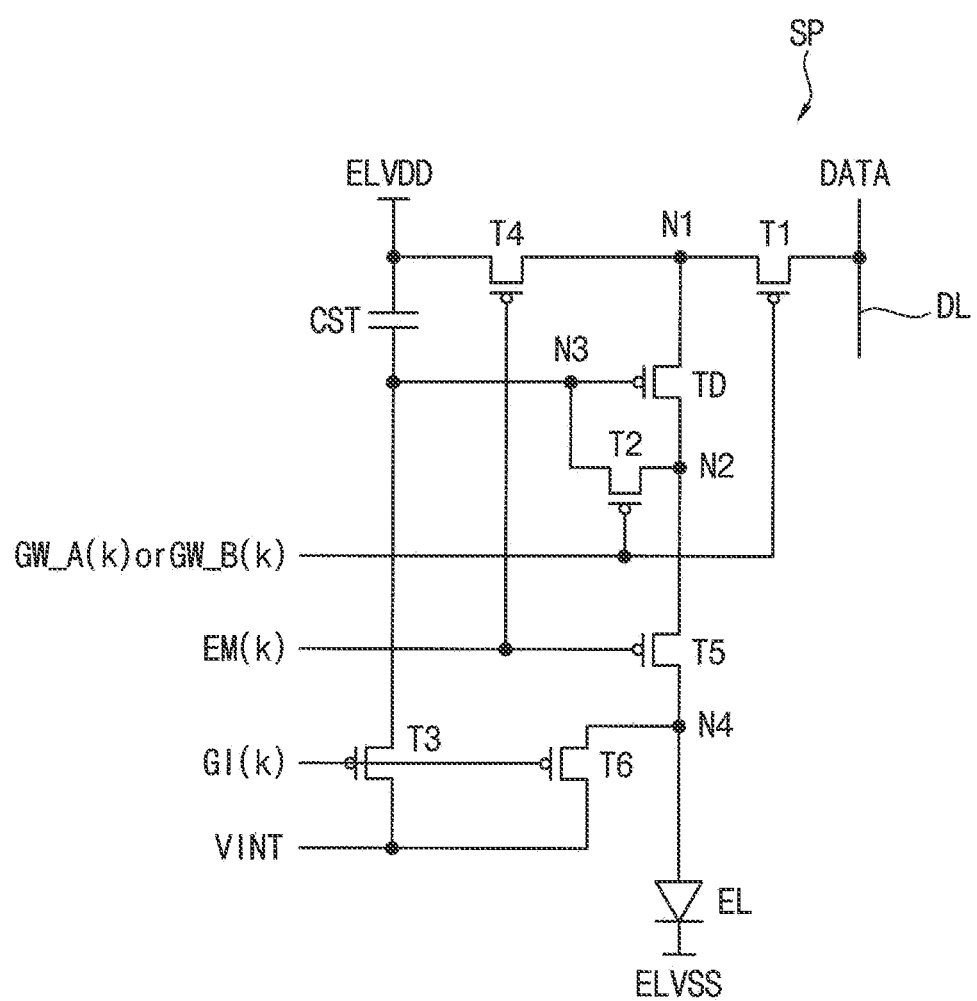
FIG. 6 is a circuit diagram illustrating a configuration of a sub-pixel included in a display panel of FIG. 2.

FIG. 6 is a circuit diagram illustrating a configuration of a sub-pixel included in a display panel of FIG. 2.

Referring to FIG. 6, each sub-pixel SP may include a driving transistor TD, first through sixth transistors T1 through T6, a storage capacitor CST and an organic light emitting diode EL.

The driving transistor TD may provide the organic light emitting diode EL with a driving current corresponding to a data voltage DATA. The driving transistor TD may include a first terminal connected to a first node N1, a second terminal connected to a second node N2, and a gate terminal connected to a third node N3.

The first transistor T1 may provide the data voltage DATA to the first node N1 in response to a first group gate signal GW_A(k) or a second group gate signal GW_B(k). The first transistor T1 may include a first terminal receiving the data voltage DATA, a second terminal connected to the first node N1, and a gate terminal receiving the first group gate signal GW_A(k) or the second group gate signal GW_B(k). For example, in a case where the sub-pixel SP is included in a first pixel group, the first transistor T1 may receive the first group gate signal GW_A(k). In a case where the sub-pixel SP is included in a second pixel group, the first transistor T1 may receive the second group gate signal GW_B(k).

The second transistor T2 may connect the second node N2 and the third node N3 (i.e., the second terminal of the driving transistor TD and the gate terminal of the driving transistor TD) in response to the first group gate signal GW_A(k) or the second group gate signal GW_B(k). The second transistor T2 may include a first terminal connected to the second node N2, a second terminal connected to the third node N3, and a gate terminal receiving the first group gate signal GW_A(k) or the second group gate signal GW_B(k). For example, in a case where the second transistor T2 is included in the first pixel group, the sub-pixel SP may receive the first group gate signal GW_A(k). In a case where the sub-pixel SP is included in a second pixel group, the second transistor T2 may receive the second group gate signal GW_B(k).

The second transistor T2 may be used to compensate for a threshold voltage of the driving transistor Td. When the second transistor T2 is turned on, the driving transistor TD may be diode-connected, and thus a threshold voltage compensation operation for the driving transistor TD may be performed.

The third transistor T3 may provide an initialization voltage VINT to the third node N3 (or the gate terminal of the driving transistor TD) in response to an initialization control signal GI(k). The third transistor T3 may include a first terminal connected to the initialization voltage VINT, a second terminal connected to the third node N3, and a gate terminal receiving the initialization control signal GI(k). The third transistor T3 may be used to initialize a voltage of the gate terminal of the driving transistor TD with the initialization voltage VINT.

The fourth transistor T4 may provide a first power supply voltage ELVDD to the first node N1 in response to an emission control signal EM(k). The fourth transistor T4 may include a first terminal connected to the first power supply voltage ELVDD, a second terminal connected to the first node N1, and a gate terminal receiving the emission control signal EM(k).

The fifth transistor T5 may electrically connect the driving transistor TD and an anode of the organic light emitting diode EL in response to the emission control signal EM(k). The fifth transistor T5 may include a first terminal connected to the second node N2, a second terminal connected to a fourth node N4, and a gate terminal receiving the emission control signal EM(k).

The sixth transistor T6 may provide the initialization voltage VINT to the fourth node N4 (e.g., the anode of the organic light emitting diode EL) in response to the initialization control signal GI(k). The sixth transistor T6 may include a first terminal connected to the initialization voltage VINT, a second node connected to the fourth node N4, and a gate terminal receiving the initialization control signal GI(k).

The storage capacitor CST may be connected between the first power supply voltage ELVDD and the third node N3.

The organic light emitting diode EL may be connected between the fourth node N4 and a second power supply voltage ELVSS. The second power supply voltage ELVSS may be lower than the first power supply voltage ELVDD.

Figure 7:
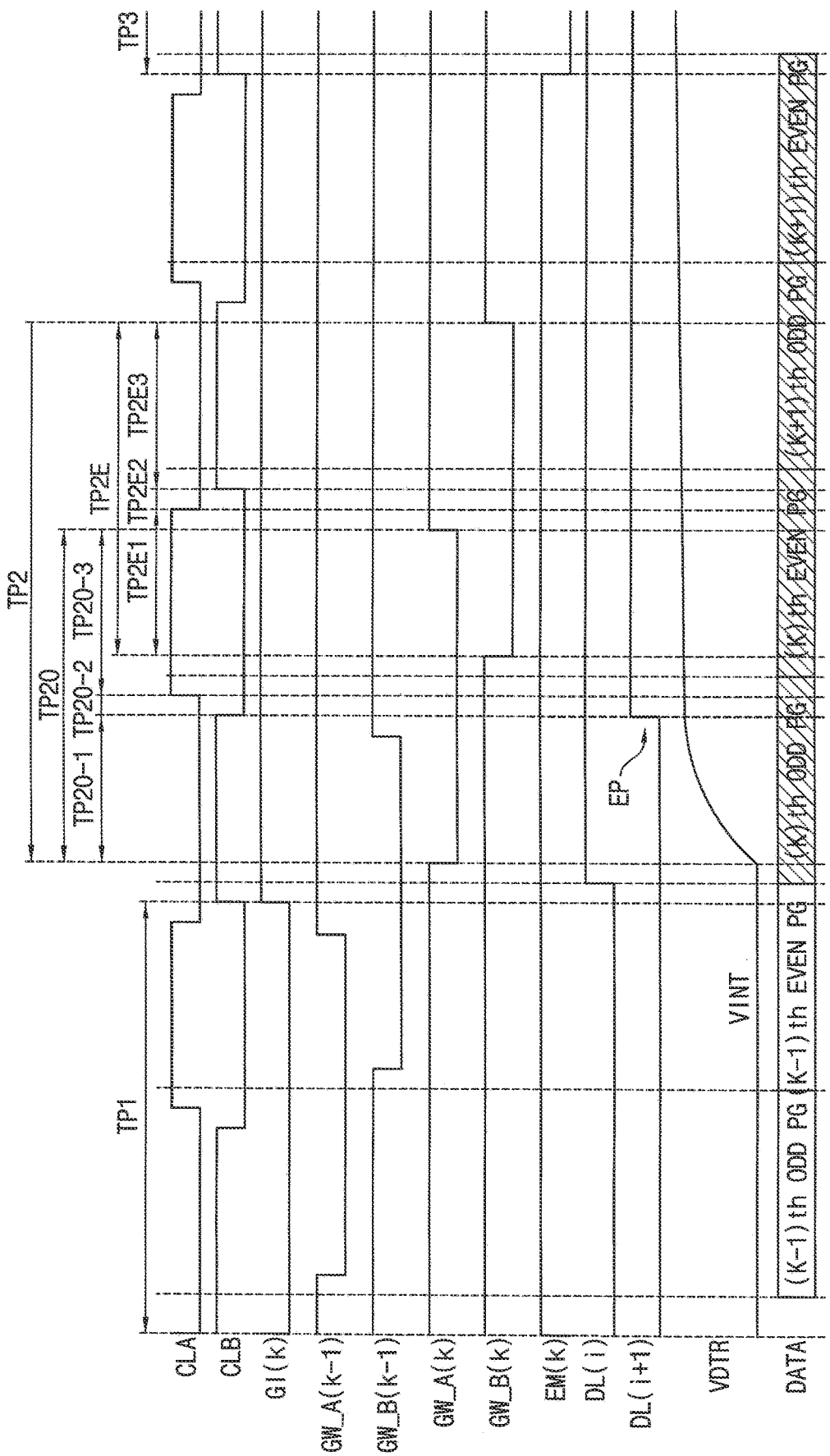
FIGS. 7 and 8 are diagrams for describing an example of an operation of a sub-pixel of FIG. 6.
Figure 8:
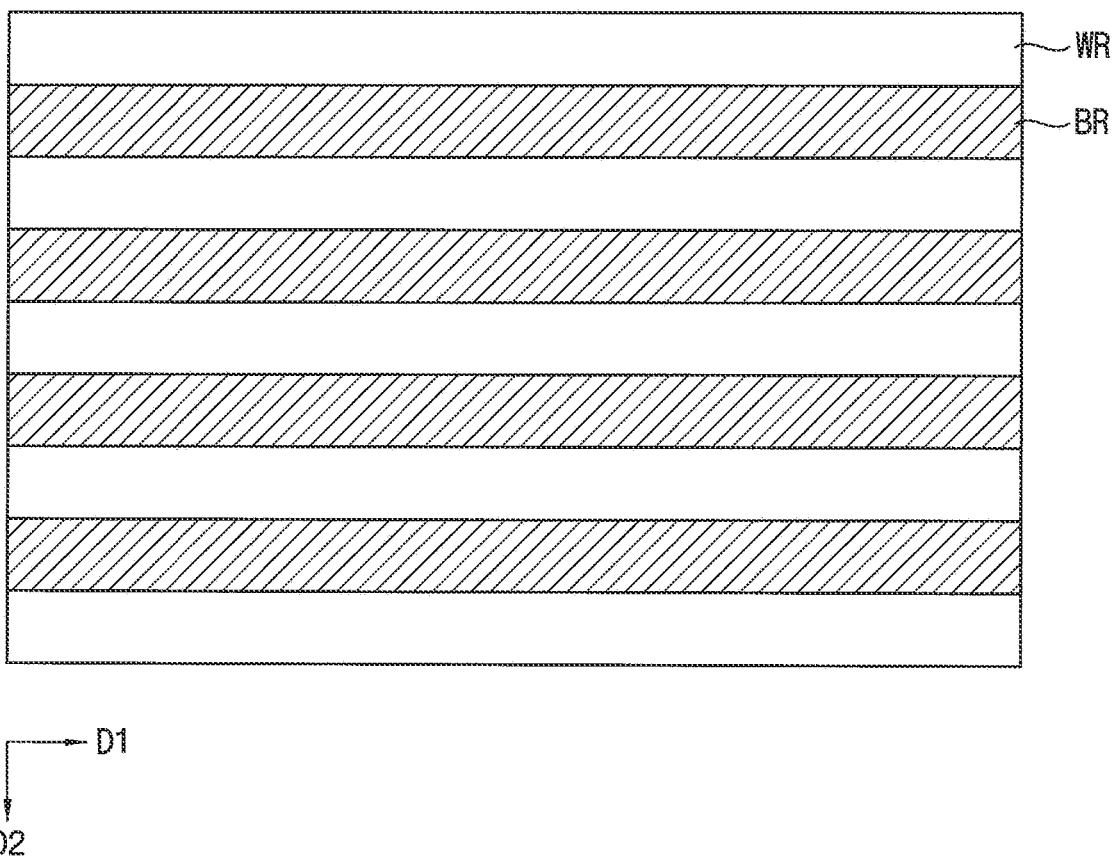

FIGS. 7 and 8 are diagrams for describing an example of an operation of a sub-pixel of FIG. 6.

Referring to FIGS. 7 and 8, one frame period for a display panel may include an initialization period TP1, a compensation period TP2 and an emission period TP3 in sequence. Hereinafter, operations of sub-pixels will be described with respect to a k-th pixel row.

In the initialization period TP1, an initialization control signal GI(k) may have an on-level, and first and second group gate signals GW_A(k) and GW_B(k) may have an off-level. In the initialization period TP1, an emission control signal EM(k) may maintain the off-level. In FIG. 7, the on-level may be a low level, and the off-level may be a high level. Accordingly, the third transistor T3 may be turned on to initialize a voltage (or a voltage of the third node N3) of the gate terminal of the driving transistor TD to the initialization voltage VINT. Further, the sixth transistor T6 may be turned on to initialize a voltage (or a voltage of the fourth node N4) of the anode of the organic light emitting diode EL to the initialization voltage VINT.

The compensation period TP2 may include a first group compensation period TP2O and a second group compensation period TP2E that partially overlap each other.

In the first group compensation period TP2O, the first group gate signal GW_A(k) may have the on-level. During the first group compensation period TP2O, the first transistors T1 and the second transistors T2 included in first pixel groups may be turned on. Thus, data voltages may be applied to the driving transistors TD included in the first pixel groups, and threshold voltages of the driving transistors TD included in the first pixel groups may be compensated. During the compensation period TP2, the initialization control signal GI(k) and the emission control signal EM(k) may have the off-level.

The first group compensation period TP2O may include a first compensation period TP2O-1, a second compensation period TP2O-2 and a third compensation period TP2O-3 in sequence.

In the first compensation period TP2O-1, a first connection control signal CLA may have the on-level, and a second connection control signal CLB may have the off-level. Thus, the data voltages may be output to data lines DL(i) connected to the first pixel groups, the data voltages may be applied to sub-pixels included in the first pixel groups, and the threshold voltages of the driving transistors TD in the first pixel groups may be compensated. For example, during the first compensation period TP2O-1, the first transistors T1 and the second transistors T2 in the first pixel groups may be turned on, the first terminals of the driving transistors TD in the first pixel groups may be electrically connected to output amplifiers of a data driver, and thus voltages VDTR of the gate terminals of the driving transistors TD in the first pixel groups may be increased close to differences between the data voltages DATA and the threshold voltages of the driving transistors TD. Before the second compensation period TP2O-2, the second group gate signal GW_B(k−1) for a (k−1)-th pixel row may be changed from the on-level to the off-level.

During the second compensation period TP2O-2, both of the first and second connection control signals CLA and CLB may have the on-level. In the second compensation period TP2O-2, voltages of data lines DL(i+1) connected to adjacent second pixel groups may be increased. Supposing that the first connection control signal CLA has the off-level and the data lines DL(i) connected to the first pixel groups are in a floating state, voltages of the data lines DL(i) connected to the first pixel groups may be changed by a coupling effect caused by the increase of the voltages of the data lines DL(i+1) connected to the second pixel groups, and thus the voltages VDTR of the gate terminals of the driving transistors TD in the first pixel groups may be changed. However, in the organic light emitting display device according to example embodiments, since the first and second connection control signals CLA and CLB have the on-level during the second compensation period TP2O-2, the data lines DL(i) connected to the first pixel groups may be connected to the output amplifiers of the data driver, and thus the voltage of the data lines DL(i) connected to the first pixel groups may not be affected by the coupling effect even if the voltages of the data lines DL(i+1) connected to the second pixel groups are increased.

Accordingly, during the first and second compensation periods TP2O-1 and TP2O-2, the data lines DL(i) connected to the first pixel groups (or first nodes of sub-pixels in the first pixel groups) may be electrically connected to the output amplifiers of the data driver, and thus a threshold voltage compensation operation (which may be referred to as an amplifier holding compensation operation) may be stably performed.

During the third compensation period TP2O-3, the first connection control signal CLA may have the off-level, and the second connection control signal CLB may have the on-level. Thus, the data lines DL(i) connected to the first pixel groups may be floated, and thus the first terminals of the first transistors T1 in the first pixel groups may be in a floating state. In the third compensation period TP2O-3, the threshold voltage compensation operation may be maintained based on voltages stored (or remaining) in the floated data lines DL(i). Accordingly, the sub-pixels in the first pixel groups may perform not only the threshold voltage compensation operation (or the amplifier holding compensation operation) during the first and second compensation periods TP2O-1 and TP2O-2 but also the threshold voltage compensation operation (which may be referred to as a floating compensation operation) during the third compensation period TP2O-3, and thus may have a sufficient threshold voltage compensation time. Accordingly, instances of a mura may be prevented or reduced and an image display quality may be improved.

The second group compensation period TP2E may partially overlap the first group compensation period TP2O. The second group compensation period TP2E may include a first compensation period TP2E-1, a second compensation period TP2E-2 and a third compensation period TP2E-3 in sequence. An operation during the second group compensation period TP2E may be substantially the same as an operation during the first group compensation period TP2O, and thus some duplicated descriptions are omitted.

In the emission period TP3, the emission control signal EM(k) may have the on-level, and the fourth and fifth transistors T4 and T5 may be turned on. Accordingly, during the emission period TP3, the organic light emitting diodes EL may emit light with luminance corresponding to the data voltages DATA.

As illustrated in FIG. 8, in a case where the organic light emitting display device displays an image including a white block WR and a black block BR extending in a pixel row direction D1, voltages of data lines may be drastically changed at a certain time point, and a coupling effect by a voltage change between the data lines may occur. For example, a voltage of an initialization voltage line for providing an initialization voltage may be changed by the voltage change of the data lines connected to the second pixel groups. Further, voltages of the data lines connected to the first pixel groups may be changed by a voltage change of the initialization voltage line. In FIG. 7, in a case where data voltages for a (k−1)-th pixel row are the data voltages corresponding to the white block WR, and data voltages for the k-th pixel row and the (k+1)-th pixel row are the data voltages corresponding to the black block BR, voltages of the data lines DL(i+1) connected to the second pixel groups may be drastically changed at a time point EP. However, because the data lines DL(i) connected to the first pixel groups are not floated but connected to the output amplifiers of the data driver, the coupling effect may be minimized.

Accordingly, because an on-period of the first connection control signal CLA partially overlaps an on-period of the second connection control signal CLB (or the first and second connection control signals CLA and CLB have the on-level during the second compensation period TP2O-2), the coupling effect by a voltage line (e.g., the initialization voltage line) near the data line may be minimized.

Figure 9:
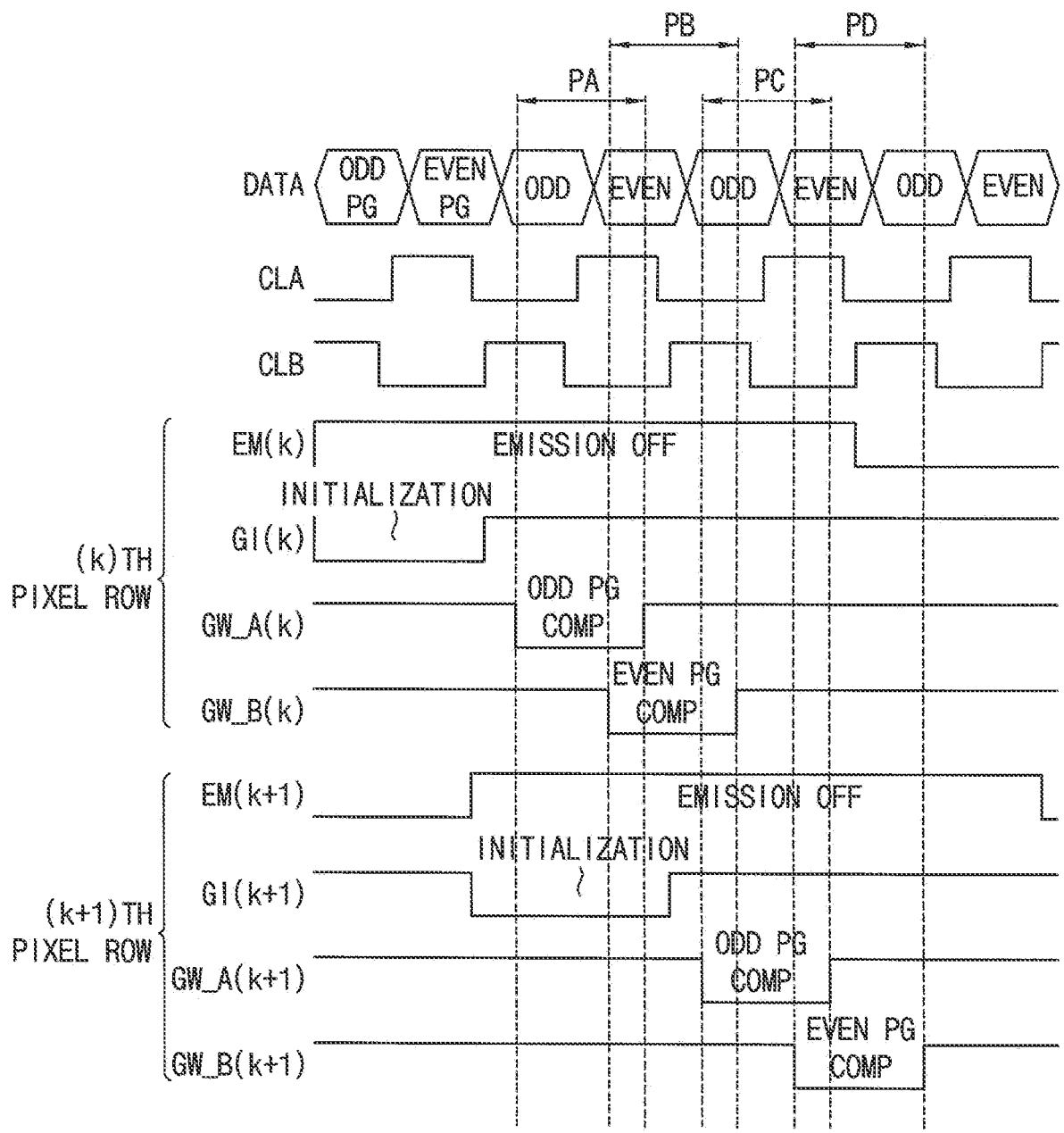
FIG. 9 is a diagram for describing an example of an operation of a display panel of FIG. 2.

FIG. 9 is a diagram for describing an example of an operation of a display panel of FIG. 2.

Referring to FIG. 9, first pixel groups and second pixel groups included in a k-th pixel row may perform an initialization operation and an emission operation in common, and may perform a data writing-threshold voltage compensation operation separately.

A k-th initialization control signal GI(k) having an on-level may be commonly applied to the first and second pixel groups of the k-th pixel row. Thus, the first and second pixel groups of the k-th pixel row may concurrently (e.g., simultaneously) perform the initialization operation.

A first group gate signal GW_A(k) for the k-th pixel row may have the on-level during a compensation period PA. Thus, sub-pixels included in the first pixel groups of the k-th pixel row may perform a data writing and threshold voltage compensation operation. Connections of data lines may be controlled based on first and second connection control signals CLA and CLB. Thus, the threshold voltage compensation operation may be performed during first and second compensation periods of the compensation period PA while the data voltages DATA are applied to the first pixel groups of the k-th pixel row, and may be maintained based on voltages stored in the floated data lines during a third compensation period of the compensation period PA.

A second group gate signal GW_B(k) for the k-th pixel row may have the on-level during a compensation period PB. The second group gate signal GW_B(k) for the k-th pixel row may partially overlap the first group gate signal GW_A(k) for the k-th pixel row. In some example embodiments, the second group gate signal GW_B(k) for the k-th pixel row may be delayed by about a half of one horizontal period from the first group gate signal GW_A(k) for the k-th pixel row.

Accordingly, in a period where the compensation period PA and the compensation period PB are overlapped, the first pixel groups of the k-th pixel row may perform a floating compensation operation, and, at the same time, the second pixel groups of the k-th pixel row may perform an amplifier holding compensation operation.

Thereafter, a first group gate signal GW_A(k+1) for the (k+1)-th pixel row may have the on-level during a compensation period PC. Thus, sub-pixels included in the first pixel groups of the (k+1)-th pixel row may perform a data writing and threshold voltage compensation operation.

In a period where the compensation period PB and the compensation period PC are overlapped, the second pixel groups of the k-th pixel row may perform the floating compensation operation, and, at the same time, the first pixel groups of the (k+1)-th pixel row may perform the amplifier holding compensation operation.

Thereafter, a second group gate signal GW_B(k+1) for the (k+1)-th pixel row may have the on-level during a compensation period PD. An operation of the (k+1)-th pixel row may be substantially the same as an operation of the k-th pixel row, and duplicated descriptions are omitted.

As described above, the first group gate signal GW_A(k) and GW_A(k+1) may partially overlap the second group gate signal GW_B(k) and GW_B(k+1), and thus the first pixel groups and the second pixel groups may perform the threshold voltage compensation operation during partially overlapped compensation periods. Further, two compensation operations (e.g., the amplifier holding compensation operation during the first and second compensation periods and the floating compensation operation during the third compensation period) may be performed with respect to respective sub-pixels, and thus a threshold voltage compensation time may be sufficient.

Figure 10:
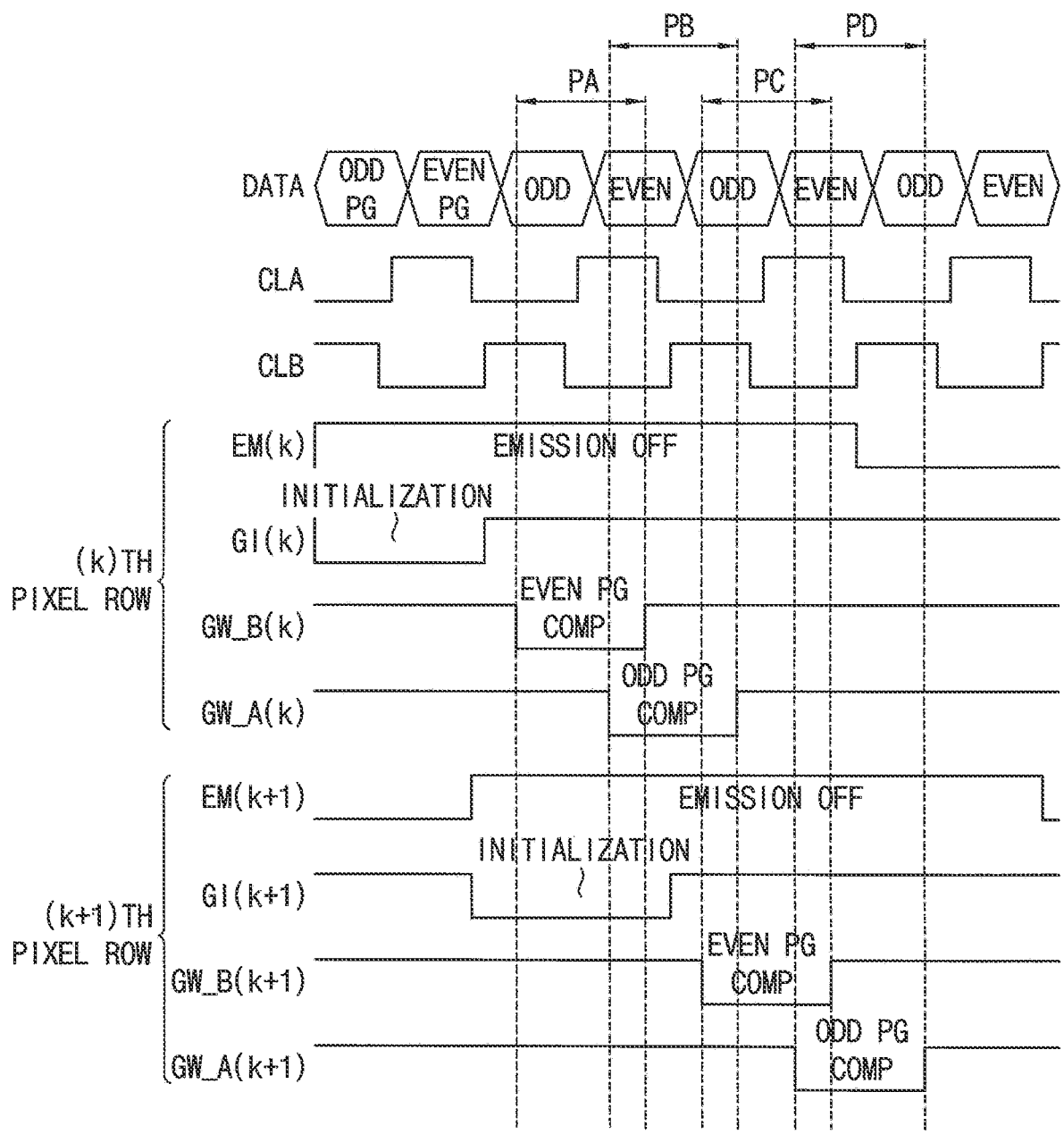
FIG. 10 is a diagram for describing another example of an operation of a display panel of FIG. 2.

FIG. 10 is a diagram for describing another example of an operation of a display panel of FIG. 2.

Referring to FIG. 10, first pixel groups and second pixel groups included in a k-th pixel row may perform an initialization operation and an emission operation in common, and may perform a data writing-threshold voltage compensation operation separately. In each pixel row, a compensation operation for the second pixel groups and a compensation operation for the first pixel groups may be sequentially performed. An operation illustrated in FIG. 10 may be substantially the same as an operation illustrated in FIG. 9, except for an order of a first group gate signal GW_A(k) and GW_A(k+1) and a second group gate signal GW_B(k) and GW_B(k+1). The same or similar reference numerals may be used to indicate the same or similar elements, and duplicated descriptions are omitted.

A second group gate signal GW_B(k) for the k-th pixel row may have an on-level during a compensation period PA. Thus, sub-pixels included in the second pixel groups of the k-th pixel row may perform a data writing and threshold voltage compensation operation.

A first group gate signal GW_A(k) for the k-th pixel row may have the on-level during a compensation period PB. In a period where the compensation period PA and the compensation period PB are overlapped, the second pixel groups of the k-th pixel row may perform a floating compensation operation, and, at the same time, the first pixel groups of the k-th pixel row may perform an amplifier holding compensation operation.

Thereafter, a second group gate signal GW_B(k+1) for the (k+1)-th pixel row may have the on-level during a compensation period PC. Thus, sub-pixels included in the second pixel groups of the (k+1)-th pixel row may perform the data writing and threshold voltage compensation operation. In a period where the compensation period PB and the compensation period PC are overlapped, the first pixel groups of the k-th pixel row may perform the floating compensation operation, and, at the same time, the second pixel groups of the (k+1)-th pixel row may perform the amplifier holding compensation operation.

A first group gate signal GW_A(k+1) for the (k+1)-th pixel row may have the on-level during a compensation period PD. In a period where the compensation period PC and the compensation period PD are overlapped, the second pixel groups of the (k+1)-th pixel row may perform the floating compensation operation, and, at the same time, the first pixel groups of the (k+1)-th pixel row may perform the amplifier holding compensation operation.

Accordingly, the organic light emitting display device may have a sufficient threshold voltage compensation time.

Figure 11:
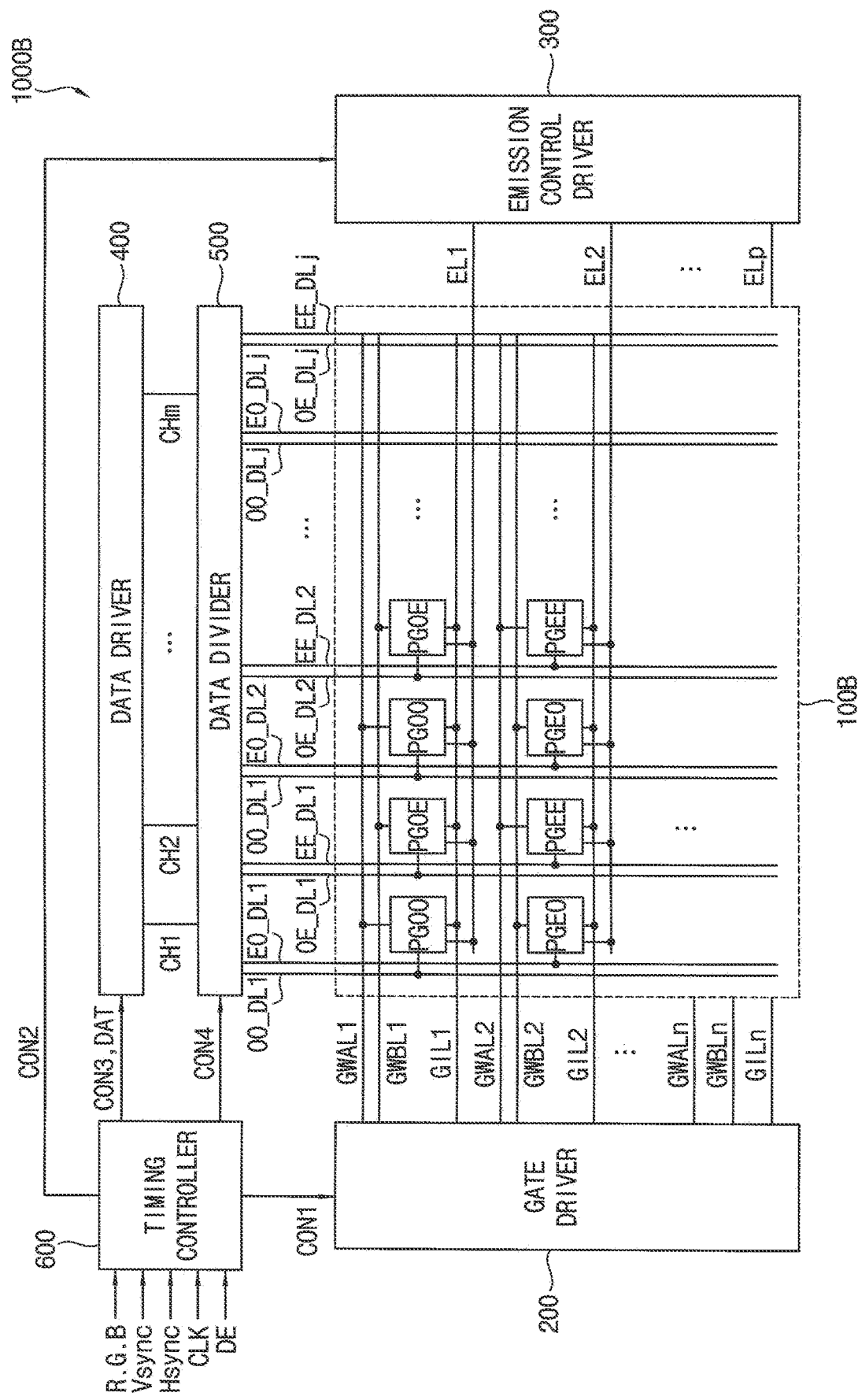
FIG. 11 is a block diagram illustrating an organic light emitting display device according to some example embodiments.
Figure 12:
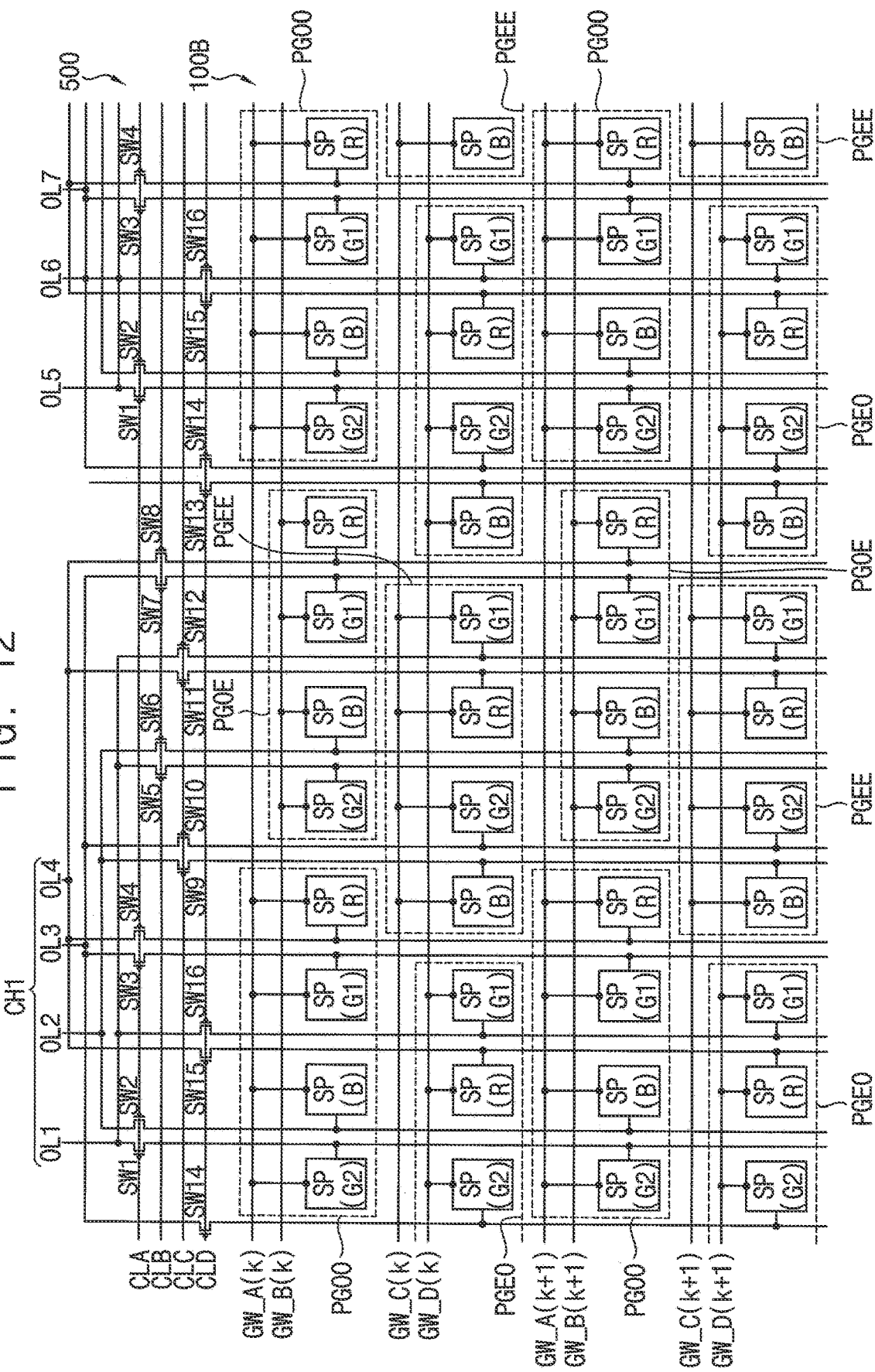
FIG. 12 is a diagram illustrating a configuration of a display panel included in an organic light emitting display device of FIG. 11.

FIG. 11 is a block diagram illustrating an organic light emitting display device according to example embodiments, and FIG. 12 is a diagram illustrating a configuration of a display panel included in an organic light emitting display device of FIG. 11.

Referring to FIGS. 11 and 12, an organic light emitting display device 1000B may include a display panel 100B, a gate driver 200, an emission control driver 300, a data driver 400, a connection controller 500 and a timing controller 600. The organic light emitting display device 1000B may be substantially the same as an organic light emitting display device 1000A of FIG. 1, except that two data line groups are arranged per one pixel group column. The same or similar reference numerals may be used to indicate the same or similar elements, and duplicated descriptions are omitted.

The display panel 100B may include a plurality of pixel rows. A first pixel row may include first pixel groups PGOO and second pixel groups PGOE that are alternately arranged. A second pixel row may include third pixel groups PGEE and fourth pixel groups PGEO that are alternately arranged. The first pixel groups PGOO may be arranged in odd-numbered pixel group rows and odd-numbered pixel group columns, the second pixel groups PGOE may be arranged in the odd-numbered pixel group rows and even-numbered pixel group columns, the third pixel groups PGEE may be arranged in even-numbered pixel group rows and the even-numbered pixel group columns, and the fourth pixel groups PGEO may be arranged in the even-numbered pixel group rows and the odd-numbered pixel group columns.

In the display panel 100B, two gate lines are utilized per one pixel group row. The first pixel groups PGOO included in the first pixel row PR1 may be connected to a first line GWAL1 of a first group gate line, and the second pixel groups PGOE included in the first pixel row PR1 may be connected to a first line GWBL1 of a second group gate line. The third pixel groups PGEE included in the second pixel row PR2 may be connected to a second line GWAL2 of the first group gate line, and the fourth pixel groups PGEO included in the second pixel row PR2 may be connected to a second line GWBL2 of the second group gate line.

The timing controller 600 may generate first through fourth control signals CON1, CON2, CON3, and CON4 to control the gate driver 200, the emission control driver 300, the data driver 400 and the connection controller 500, respectively.

Based on the first control signal CON1, the gate driver 200 may provide a first group gate signal GW_A(k) to the first pixel groups PGOO, may provide a second group gate signal GW_B(k) to the second pixel groups PGOE, may provide a third group gate signal GW C(k) to the third pixel groups PGEE, and may provide a fourth group gate signal GW D(k) to the fourth pixel groups PGEO.

Further, the gate driver 200 may sequentially output an initialization control signal to initialization control lines GIL1 through GILn based on the first control signal CON1.

The emission control driver 300 may sequentially output an emission control signal through emission control lines EL1 through ELn based on the second control signal CON2.

The data driver 400 may output data voltages to a plurality of output line groups CH1 through CHm based on the third control signal CON3 and output image data DAT provided from the timing controller 600.

The connection controller 500 may control connections between the output line groups CH1 through CHm and data line groups OO_DL1 through OO_DLm, OE_DL1 through OE_DLm, EE_DL1 through EE_DLm and EO_DL1 through EO_DLm based on the fourth control signal CON4.

As illustrated in FIGS. 11 and 12, the connection controller 500 may connect the output line groups CH1 through CHm to a first data line group OO_DL1 through OO_DLm in response to a first connection control signal CLA, may connect the output line groups CH1 through CHm to a second data line group OE_DL1 through OE_DLm in response to a second connection control signal CLB, may connect the output line groups CH1 through CHm to a third data line group EE_DL1 through EE_DLm in response to a third connection control signal CLC, and may connect the output line groups CH1 through CHm to a fourth data line group EO_DL1 through EO_DLm in response to a fourth connection control signal CLD.

For example, the connection controller 500 may include first through fourth switches SW1, SW2, SW3 and SW4 that connect first through fourth output lines OL1 through OL4 to the first pixel group PGOO in response to the first connection control signal CLA, fifth through eighth switches SW5, SW6, SW7 and SW8 that connect the first through fourth output lines OL1 through OL4 to the second pixel group PGOE in response to the second connection control signal CLB, ninth through twelfth switches SW9, SW10, SW11 and SW12 that connect the first through fourth output lines OL1 through OL4 to the third pixel group PGEE in response to the third connection control signal CLC, and thirteenth through sixteenth switches SW13, SW14, SW15 and SW16 that connect the first through fourth output lines OL1 through OL4 to the fourth pixel group PGEO in response to the fourth connection control signal CLD.

The display panel 100B may include sub-pixels that are arranged in a pentile pixel arrangement. In some example embodiments, each of the first and second pixel groups PGOO and PGOE may include a first pixel and a second pixel adjacent to the first pixel. The first pixel may include a first sub-pixel SP(G2) emitting a second color light (e.g., a green light) and a second sub-pixel SP(B) emitting a third color light (e.g., a blue light). The second pixel may include a third sub-pixel SP(G1) emitting the second color light (e.g., the green light) and a fourth sub-pixel SP(R) emitting a first color light (e.g., a red light). Each of the third and fourth pixel groups PGEE and PGEO may include a third pixel and a fourth pixel adjacent to the third pixel. The third pixel may include a fifth sub-pixel SP(B) emitting the third color light (e.g., the blue light) and a sixth sub-pixel SP(G2) emitting the second color light (e.g., the green light). The fourth pixel may include a seventh sub-pixel SP(R) emitting the first color light (e.g., the red light) and an eighth sub-pixel SP(G1) emitting the second color light (e.g., the green light).

In the display panel 100B, two data lines may be utilized per one sub-pixel column. For example, a first data line connected to the first sub-pixel SP(G2) and a second data line connected to the second sub-pixel SP(B) may be positioned between the first sub-pixel SP(G2) and the second sub-pixel SP(B), and may extend in a pixel column direction. A third data line connected to the third sub-pixel SP(G1) and a fourth data line connected to the fourth sub-pixel SP(R) may be positioned between the third sub-pixel SP(G1) and the fourth sub-pixel SP(R), and may extend in the pixel column direction.

A fifth data line connected to the fifth sub-pixel SP(B) and a sixth data line connected to the sixth sub-pixel SP(G2) may be positioned between the first pixel and the second pixel, and may extend in the pixel column direction.

A seventh data line connected to the seventh sub-pixel SP(R) and an eighth data line connected to the eighth sub-pixel SP(G1) may be positioned between the second sub-pixel SP(B) and the third sub-pixel SP(G1), and may extend in the pixel column direction.

Figure 13:
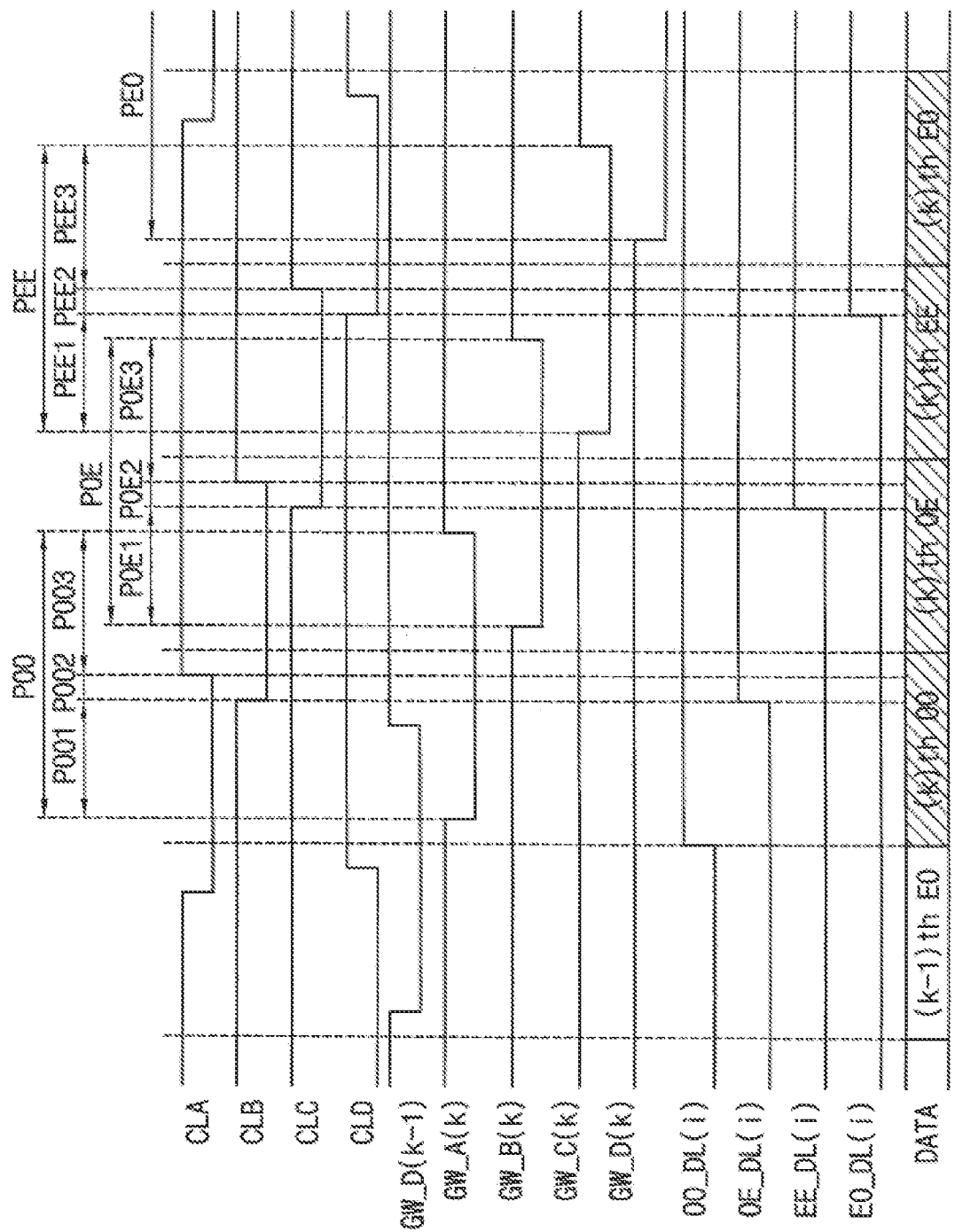
FIG. 13 is a diagram for describing an example of an operation of a sub-pixel included in an organic light emitting display device of FIG. 11.

FIG. 13 is a diagram for describing an example of an operation of a sub-pixel included in an organic light emitting display device of FIG. 11.

Referring to FIG. 13, one frame period for a display panel may include an initialization period, a compensation period and an emission period in sequence. The compensation period may include a first group compensation period POO, a second group compensation period POE, a third group compensation period PEE and a fourth group compensation period PEO. Operations during the initialization period and the emission period are described above with reference to FIG. 7, and thus duplicated descriptions are omitted.

In the first group compensation period POO, a first group gate signal GW_A(k) may have an on-level. During the first group compensation period POO, first transistors T1 and second transistors T2 included in first pixel groups may be turned on. Thus, data voltages may be applied to driving transistors included in the first pixel groups, and the driving transistors may be diode-connected to compensate the threshold voltages of the driving transistors.

The first group compensation period POO may include a first compensation period POO1, a second compensation period POO2 and a third compensation period POO3 in sequence.

In the first compensation period POO1, a first connection control signal CLA may have the on-level, and second through fourth connection control signals CLB, CLC, and CLD may have an off-level. Thus, the data voltages may be output to data lines OO_DL(i) connected to the first pixel groups, the data voltages may be applied to sub-pixels included in the first pixel groups, and the threshold voltages of the driving transistors in the first pixel groups may be compensated.

During the second compensation period POO2, the first and second connection control signals CLA and CLB may have the on-level, and the third and fourth connection control signals CLC and CLD may have the off-level. In the second compensation period POO2, voltages of data lines OE_DL(i) connected to adjacent second pixel groups may be increased. Supposing that the first connection control signal CLA has the off-level and the data lines OO_DL(i) connected to the first pixel groups are in a floating state, voltages of the data lines OO_DL(i) connected to the first pixel groups may be changed by a coupling effect caused by the increase of the voltages of the data lines OE_DL(i) connected to the second pixel groups, and thus voltages of gate terminals of the driving transistors in the first pixel groups may be changed. However, in the organic light emitting display device according to example embodiments, since the first and second connection control signals CLA and CLB have the on-level during the second compensation period POO2, the data lines OO_DL(i) connected to the first pixel groups may be connected to output amplifiers of a data driver, and thus the voltage of the data lines OO_DL(i) connected to the first pixel groups may not be affected by the coupling effect even if the voltages of the data lines OE_DL(i) connected to the second pixel groups are increased.

During the third compensation period POO3, the first, third and fourth connection control signals CLA, CLC, and CLD may have the off-level, and the second connection control signal CLB may have the on-level. Thus, the data lines OO_DL(i) connected to the first pixel groups may be floated, and thus first terminals of the first transistors in the first pixel groups may be in a floating state. In the third compensation period POO3, the threshold voltage compensation operation may be maintained based on voltages stored (or remaining) in the floated data lines OO_DL(i). Accordingly, the sub-pixels in the first pixel groups may perform not only the threshold voltage compensation operation during the first and second compensation periods POO1 and POO2 but also the threshold voltage compensation operation during the third compensation period POO3, and thus may have a sufficient threshold voltage compensation time. Accordingly, instances of a mura may be prevented or reduced and an image display quality may be improved.

The second group compensation period POE may partially overlap the first group compensation period POO. The second group compensation period POE may include a first compensation period POE1, a second compensation period POE2 and a third compensation period POE3 in sequence. An on-period of the second connection control signal CLB and an on-period of the third connection control signal CLC may partially overlap each other in the second compensation period POE2 of the second group compensation period POE. An operation during the second group compensation period POE may be substantially the same as an operation during the first group compensation period POO, and thus duplicated descriptions are omitted.

The third group compensation period PEE may partially overlap the second group compensation period POE. The third group compensation period PEE may include a first compensation period PEE1, a second compensation period PEE2 and a third compensation period PEE3 in sequence. An on-period of the third connection control signal CLC and an on-period of the fourth connection control signal CLD may partially overlap each other in the second compensation period POE2 of the third group compensation period PEE. An operation during the third group compensation period PEE may be substantially the same as an operation during the first group compensation period POO, and thus duplicated descriptions are omitted.

The fourth group compensation period PEO may partially overlap the third group compensation period PEE. The fourth group compensation period PEO may be similar to each of the first through third group compensation periods POO, POE and PEE.

Accordingly, the on-periods of the first through fourth connection control signals CLA, CLB, CLC and CLD may be partially overlap each other, and thus the coupling effect by a voltage line near the data line may be minimized.

Aspects of example embodiments may be applied to any electronic device including an organic light emitting display device. For example, the inventive concepts may be applied to a television (TV), a digital TV, a 3D TV, a smart phone, a mobile phone, a tablet computer, a personal computer (PC), a home appliance, a laptop computer, a personal digital assistant (PDA), a portable multimedia player (PMP), a digital camera, a music player, a portable game console, a navigation device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. For example, although example embodiments where each pixel group includes two pixels and each pixel includes two sub-pixels are described above, the structure of the pixel group and the arrangement of the pixels may not be limited thereto.

Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and their equivalents.

What is claimed is:

1. An organic light emitting display device comprising:
a display panel including a first pixel row and a second pixel row adjacent to the first pixel row, the first pixel row including first pixel groups alternating with second pixel groups, and the second pixel row including third pixel groups alternating with fourth pixel groups;
a gate driver configured to provide a first group gate signal to the first pixel groups, to provide a second group gate signal to the second pixel groups, to provide a third group gate signal to the third pixel groups, and to provide a fourth group gate signal to the fourth pixel groups;
a data driver configured to output data voltages to a plurality of output line groups; and
a connection controller configured to connect the output line groups to a first data line group in response to a first connection control signal, to connect the output line groups to a second data line group in response to a second connection control signal, to connect the output line groups to a third data line group in response to a third connection control signal, and to connect the output line groups to a fourth data line group in response to a fourth connection control signal,
wherein an on-period of the second group gate signal partially overlaps an on-period of the first group gate signal,
wherein the first data line group is connected to the first pixel groups included in the first pixel row, the second data line group is connected to the second pixel groups included in the first pixel row, the third data line group is connected to the third pixel groups included in the second pixel row, and the fourth data line group is connected to the fourth pixel groups included in the second pixel row, and
wherein an on-period of the first connection control signal partially overlaps an on-period of the second connection control signal,
wherein one frame period includes an initialization period, a compensation period and an emission period in sequence,
wherein the compensation period includes a first compensation period, a second compensation period and a third compensation period in sequence,
wherein, in the first compensation period, the first connection control signal has an on-level, and the second connection control signal has an off-level,
wherein, in the second compensation period, both of the first and second connection control signals have the on-level, and
wherein, in the third compensation period, the first connection control signal has the off-level, and the second connection control signal has the on-level.

2. The organic light emitting display device of claim 1, wherein, during the initialization period, a gate terminal of a driving transistor of a sub-pixel included in each of the first pixel groups is initialized by an initialization voltage,
wherein, during the compensation period, the data voltage is transferred to the driving transistor, and a threshold voltage of the driving transistor is compensated, and
wherein, during the emission period, an organic light emitting diode of the sub-pixel emits light.

3. The organic light emitting display device of claim 1, wherein, in the first and second compensation periods, a data line for providing the data voltage to the sub-pixel is electrically connected to an output amplifier of the data driver.

4. The organic light emitting display device of claim 1, wherein, in the third compensation period, the data line for providing the data voltage to the sub-pixel is in a floating state.

5. The organic light emitting display device of claim 1, wherein each of the first pixel groups includes a first pixel and a second pixel adjacent to the first pixel,
   wherein the first pixel includes a first sub-pixel emitting a second color light, and a second sub-pixel emitting a third color light, and
   wherein the second pixel includes a third sub-pixel emitting the second color light, and a fourth sub-pixel emitting a first color light.

6. The organic light emitting display device of claim 5, wherein a first data line connected to the first sub-pixel and a second data line connected to the second sub-pixel are between the first sub-pixel and the second sub-pixel, and extend in a pixel column direction, and
   wherein a third data line connected to the third sub-pixel and a fourth data line connected to the fourth sub-pixel are between the third sub-pixel and the fourth sub-pixel, and extend in the pixel column direction.

7. The organic light emitting display device of claim 6, wherein each of the third pixel groups includes a third pixel and a fourth pixel adjacent to the third pixel,
   wherein the third pixel includes a fifth sub-pixel emitting the third color light, and a sixth sub-pixel emitting the second color light,
   wherein the fourth pixel includes a seventh sub-pixel emitting the first color light, and an eighth sub-pixel emitting the second color light, and
   wherein a fifth data line connected to the seventh sub-pixel and a sixth data line connected to the eighth sub-pixel are between the second sub-pixel and the third sub-pixel, and extend in the pixel column direction.

* * * * *